Aug. 17, 1965 R. L. LONGINI 3,201,596

SEQUENTIAL TRIP SEMICONDUCTOR DEVICE

Filed Dec. 17, 1959 3 Sheets-Sheet 1

Aug. 17, 1965 R. L. LONGINI 3,201,596

SEQUENTIAL TRIP SEMICONDUCTOR DEVICE

Filed Dec. 17, 1959 3 Sheets-Sheet 3

WITNESSES

John E. Healy, Jr.

Gordon H. Telfer

INVENTOR

Richard L. Longini

BY

Frederick Shapoe

ATTORNEY

United States Patent Office 3,201,596
Patented Aug. 17, 1965

3,201,596

SEQUENTIAL TRIP SEMICONDUCTOR DEVICE

Richard L. Longini, Pittsburgh, Pa., assignor to Westinghouse Electric Corporation, East Pittsburgh, Pa., a corporation of Pennsylvania Filed Dec. 17, 1959, Ser. No. 860,174
10 Claims. (Cl. 307—88.5)

This invention relates generally to semiconductor devices and, more particularly, to unitary bodies of semiconductor material having therein a plurality of controllably interacting semiconductive regions.

Recent effort in the art of semiconductor devices has been directed to developing large numbers of individual semiconductive elements, such as diodes or transistors, for example, within a unitary body of material of small size. Semiconductor devices are finding increasingly wide acceptance in the electronics industry because of their compactness and other advantages achieved in some applications such as low heat dissipation, low cost, and long life relative to many conventional components of the vacuum tube type. However, miniaturization of individual semiconductor devices requires increasingly great fabricating skills in forming the devices and in interconnecting them in a usable circuit.

Therefore, it is desirable to avoid such fabrication problems by making multielement devices, in which each element individually performs the functions of a single circuit element, having common semiconductive regions requiring no interconnection by conventional conductors or other external circuit elements. Such multielement devices have a much greater reliability than a device comprising many conventional externally interconnected elements. Some of the methods by which such devices may be fabricated will be discussed hereinafter in describing methods of forming devices in accordance with the present invention. In addition to the advantages in the form of miniaturization and ease in fabrication which are possible in making multiple devices in a single unit, it has also been found that new forms of interaction are provided by devices made in this manner which are not possible using conventional elements, whether semiconductive or not.

It is, therefore, a principal object of the present invention to provide semiconductor devices, a plurality of which may be fabricated in a single unit of material; the interaction between which elements is of a type and nature which is not achievable by conventionally interconnected circuit elements.

In the furtherance of this principal object, a monolithic device in accordance with the present invention comprises at least two bistable semiconductor elements having a common semiconductive region with means associated therewith to produce a state of excess carrier density in one of said semiconductor elements and, also, means to direct excess carriers from the first to the second semiconductor element. In the second semiconductor element, the excess carriers are operative to switch the second semiconductor element from a first to a second stable state.

It is another object of the present invention to provide an improved, solid state flip-flop or bistable circuit.

Another object is to provide a large number of solid state flip-flop or bistable circuits in a single unit of material.

Another object is to provide an improved solid state counter circuit.

Another object is to provide improved methods of fabricating a plurality of semiconductor devices in a unitary body of material.

These and other objects of this invention will be apparent from the following description, taken in accordance with the accompanying drawing, throughout which like reference characters indicate like parts, which drawing forms a part of this application and in which.

Figure 1:
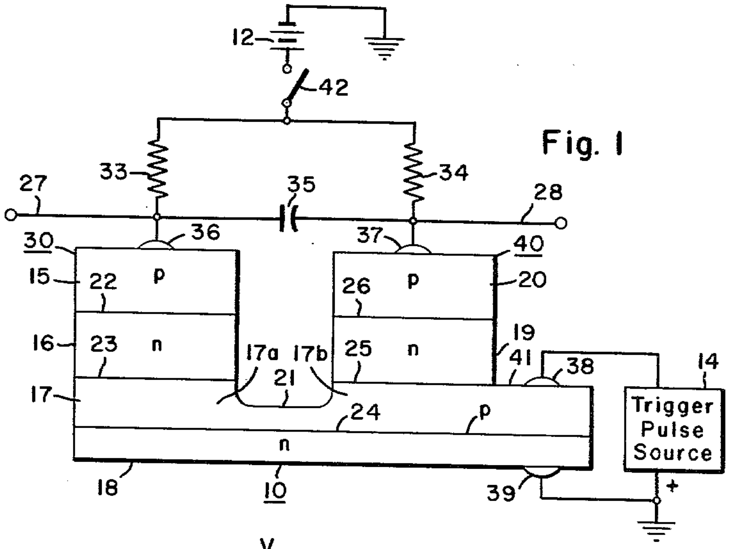
FIGURE 1 is a schematic diagram, partly in elevation, of one embodiment of the present invention in the form of a solid state bistable circuit.

Referring now to FIG. 1, there is shown a solid state bistable circuit in accordance with the present invention comprising a single semiconductor body 10 connected conventionally to external power sources 12 and 14. The semiconductor body comprises six regions 15, 16, 17, 18, 19 and 20 of semiconductive material of alternate conductivity type which are shown in FIG. 1 to be p, n, p, n, n and p, respectively. Between regions of opposite conductivity type, there exists p-n or rectifying junctions 22, 23, 24, 25 and 26 whose characteristics are well known in the art. In physical appearance the semiconductor body 10 may be considered to be a four-layer device of alternate p-type and n-type conductivity regions, selected portions of which are removed to provide the above-named six regions and thereby enable desired operation of the complete device.

It will be most convenient in understanding the operation of the present invention to consider the semiconductor body 10 as two four-layer, bistable devices, or elements, having common regions 17 and 18. A first bistable element 30 comprises the alternate conductivity regions 15, 16, 17 and 18. The second four-layer bistable element 40, comprises the alternate conductivity regions 18, 17, 19 and 20. It is readily seen that the two elements 30 and 40 have in common the n-type layer 18 and the p-type layer 17. The n-type layer 18 serves as a common base layer to the two elements 30 and 40. The common base layer 18 may have a uniform cross section. However, the p-type layer 17, which may be termed the connecting layer, preferably has a restricted portion 21. For purposes of explanation, it will be convenient to consider the connecting layer 17 as being comprised of a first portion 17*a* as part of the first element 30 and a second portion 17*b* as part of the second element 40, which two portions are separated and connected by the restricted portion 21. The first and second layers of semiconductive material are physically separated into two portions comprising the regions 15 and 16 in the first element 30 and the regions 19 and 20 in the second element 40. Summing up, the semiconductor body 10 comprises a common base layer 18 having a rectifying p-n junction 24 in common with a connecting layer 17 which is continuous but has a region of decreased thickness comprising the restricted portion 21 and imposed on top of the two continuous layers 17 and 18 are the two physically separated layers 16–19 and 15–20.

A first power source 12 is coupled through a switch 42 to the two elements 30 and 40 through coupling or load resistors 33 and 34 by means of ohmic contacts 36 and 37 to the separate p-type regions 15 and 20, respectively. Accordingly, the first power source 12 is connected in circuit relationship to provide a flow of positive current in parallel manner through the two elements 30 and 40. Between the conductors connecting the two elements 30 and 40 through the first power source 12 there is provided a coupling capacitor 35, the purpose of which will be more fully described hereafter. Also, leads 27 and 28 are connected to a suitable load, signal device, meter or apparatus to be operated or controlled by the device.

Across the common connecting region 17 and the common base 18 of the semiconductor body 10 a second power source 14 is disposed in circuit relationship by connection to the semiconductor material by the ohmic contacts 38 and 39. The second power source 14 is a trigger pulse source normally being applied so that the junction 24 is in the blocking, or reverse biased, state. An extended portion 41 is provided on the semiconductor body 10 to make application of the ohmic contacts 38 and 39 more convenient. However, the provision of the extended portion 41 as such is not a necessity since ohmic contact may be made to layers 17 and 18 at their end or side faces.

The first power source 12 provides a continuous D.C. voltage of about 10 volts positive with respect to ground between each of the p-type regions 15 and 20 and the common n-type base 18 which is maintained at ground potential. At the instant of connecting the first power source 12 through the switch 42 to the semiconductive elements 30 and 40, the elements 30 and 40 are in a state of low conductivity, or high resistance, by reason of the fact that the rectifying junctions 23 and 25 are reverse biased at a voltage level below breakdown. Therefore, conduction across the junctions 23 and 25 is relatively small and for practical purposes no current flows. The p-n junctions 23 and 25 will be referred to as the first and second breakdown junctions, respectively, since it is by reason of their breakdown that the elements 30 and 40 have a bistable characteristic.

Figure 2:
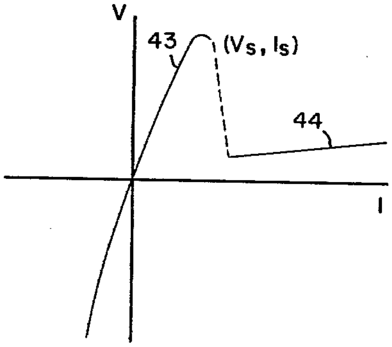
FIG. 2 is a curve of the current-voltage characteristic of a single, four-layer element of the device shown in FIG. 1.

Referring to FIG. 2, there is shown the current-voltage characteristics of the device of FIG. 1. Before firing, each element 30 and 40 is operating in the region 43 from the origin to the point ($V_S$, $I_S$) on the curve shown in FIG. 2 which shows the current-voltage characteristic of each of the individual elements 30, 40. The parameters of the circuit shown in FIG. 1 are established such that the power source 12 can cause to be built up across the rectifying junctions 23 and 25 a potential which exceeds the breakdown of switching potential $V_s$ indicated in FIG. 2. Since the two elements 30 and 40 are connected to the continuous power source 12 in parallel circuit relationship, the values of the coupling resistors 33 and 34 are adjusted so that the potential across one of the elements will exceed the switching potential at a voltage lower than that across the other element.

For purposes of illustration, it will be assumed that in the device shown in FIG. 1, the first element 30 is so adjusted that it is affected at a lower voltage so that it is the first to trip to the "on" or conductive position. Upon breakdown, the voltage across the fired element 30 drops to a very low level, typically only a fraction of one volt, as shown in the region 44 of the curve in FIG. 2. Coupling capacitor 35 prevents an instantaneous change in voltage difference across it so that the voltage across the second breakdown junction 25 is suddenly greatly reduced when the first element 30 fires. This occurs before the voltage across junction 25 reaches $V_S$. Therefore, the first element 30 is maintained in the "on" position and the second element is maintained in the "off" position, under the aforementioned conditions. Following this, the capacitor 35 is charged by a flow of current through resistors 33 and 34.

Subsequently, upon application of a triggering pulse by means of the trigger pulse source 14 across the two continuous layers of the device, the voltage across the second element 40 is caused to exceed the switching voltage $V_S$, and the element 40 fires, i.e., it becomes conductive. Upon firing, the second element 40 goes to the low-voltage state, and at the same time affects the left-hand element by reason of the coupling capacitor 35, so that it becomes non-conductive. Therefore, the device comprising the semiconductor body 10 is at any time after initial firing in one of two stable states. In a first state, the first element 30 is "on," (that is, the potential and current are on portion 44 of the curve of FIG. 2) and the second element 40 is "off" (portion 43 of the curve). In the second stable state, the conditions of the two elements are reversed. Therefore, it is seen that not only each element 30 and 40 has a bistable characteristic but the unitary device 10 comprising both elements does also.

An output may be derived from either lead 27 or 28 attached to the first element 30 and the second element 40, respectively. The leads 27, 28 will be at a high positive potential if the element to which they are connected is "off" and at a low potential if the element is "on."

To fully comprehend the scope of the present invention, it is essential that the physical processes taking place in the semiconductor body under the above described operating conditions be understood. When a bistable element 30 or 40 is "off," the number of holes and electrons in the portion of the p-type connecting layer in that element is near the equilibruim number, that is, recombination of carriers occurs at about the same rate as thermal generation of carriers. An excess carrier density, also known as non-equilibrium carrier concentration, is established in the p-type region 17*a* of the first element 30 upon firing of that element. This occurs by reason of the injection of minority carriers (electrons) upon breakdown with a resultant increase in the number of holes to balance the charge. That is, charges entering from the n-type region 16 upon breakdown of the junction 23 build up in the region 17*a* to a density significantly greater than that prevailing in the connected p-type region 17*b* which is at equilibrium since the element 40 is "off." Upon the application of the triggering pulse from voltage source 14 to the second element 40, which triggering pulse is in the from of a reverse bias across the junction 24 between the two continuous layers 17 and 18, a field is established between the p-regions 17*a* and 17*b* causing the acceleration of the excess charges from the first portion 17*a* of the connecting layer 17 to the second portion 17*b*. The lower n-type layer provides charges which are attracted to the charges of opposite sign in the p-type region 17*b* and maintains them in the second element 40 even after the termination of the triggering pulse.

Figure 3:
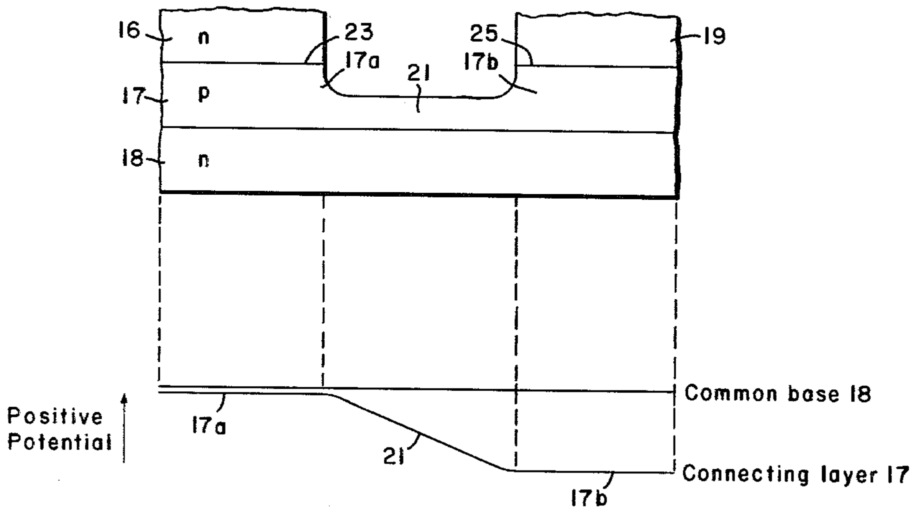
FIG. 3 is a diagram of the potential distribution in a portion of the device of FIG. 1 upon the application of a triggering pulse.

FIG. 3 shows part of the semiconductor body 10 and a potential diagram showing how the field which moves the charges is established. It should be noted that the restricted portion 21 is important because it is the large potential difference across this portion that is primarily responsible for the field. Without a restricted portion 21 the magnitude of the electric field between the first portion 17*a* of the connecting layer 17 and the second portion 17*b* would be much less.

Therefore, it is seen that the firing of the first element 30 establishes a semiconductive region of excess carrier density. In accordance with the present invention, the excess carrier density may be utilized in a unique manner by reason of the connecting layer 17 between the two elements 30 and 40 and the continuous base 18. The application of the triggering pulse provides a means of utilizing the excess carrier density to cause the triggering of the second element 40 from the "off" to the "on" position. At this same time, because of the capacitive coupling between the elements, the first element 30 can be caused to go "off." Therefore, the structure of FIG. 1 provides a switching device operable in the manner of a flip-flop or bistable circuit.

After the second element 40 has fired and the first element 30 has been put into the non-conducting state by coupling through the capacitor 35, the initial state in which both elements are "off" may be achieved by momentarily opening and then reclosing the switch 42. This could be performed electrically by connecting the output lead 28 of the second element 40 to a relay to open switch 42 and then to close it.

Modifications of the device shown in FIG. 1 will be readily apparent to those skilled in the art. For example, it is apparent that the regions of differing conductivity type may be reversed. That is, the structure may be of the n-p-n-p type rather than the p-n-p-n type as shown. This difference would merely require that the voltage polarities be reversed. A further modification is to employ a metal-n-p-n or metal-p-n-p type structure such as is taught, as a single element, in copending application Serial No. 642,743, filed February 27, 1957, entitled "Semiconductor Diode" by J. Phillips, now Patent 2,953,693 issued September 20, 1960, and assigned to the same assignee as the present invention. When such a structure is employed, the separated p-regions 15, 20 of the device shown in FIG. 1 would be replaced by a metal capable of injecting minority carriers. The junction between the metal and semiconductor regions must be such as to enable the metal to carry some current by injection of minority carriers across the junction. It should be clear that the bistability of the individual elements 30, 40 need not be of the type indicated by FIG. 2.

Also, it is to be understood that the triggering pulse may be applied to either the p-type region 17*b* or the n-type region 19. When applied in the latter manner, the polarity of the pulsed voltage source 14 is reversed from that shown in FIG. 1.

The device shown may, of course, be further modified by providing on the first element 30 an ohmic contact for applying a triggering pulse similar to that which is provided on the second element 40 in FIG. 1. The purpose of such additional triggering pulses would be, of course, to provide a second input to the device so that the state of the elements 30 and 40 would be switched upon the application of a triggering pulse to either elements depending on which is initially in the "on" position. In this case, the resistors 33 and 34, as shown in FIG. 1, may have equal resistances. Which of the two elements 30, 40 fires first is therefore determined by chance.

Figure 4:
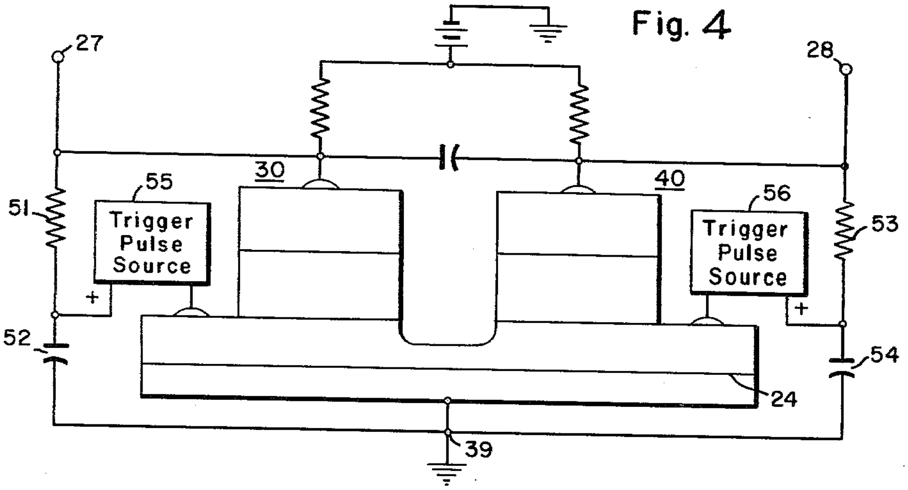
FIG. 4 is a schematic diagram, partly in elevation, of an alternative embodiment of the present invention.

A further modification, shown in FIG. 4, is to provide a multivibrator by employing a resistor 51 and a capacitor 52 between the triggering pulse source 55 and the outputs 27 and 39 of the first element 30; a resistor 53 capacitor 54 and triggering pulse source 56 are arranged in the same manner in relation to the outputs 28 and 39 of the second semiconductor element 40. If the circuit parameters are so selected that the firing of an element occurs merely by voltage build-up after a first element fires, then a free running multivibrator may be provided which would not require the triggering pulse sources 55 and 56.

The triggering pulse sources 14 in FIG. 1 and 55 and 56 in FIG. 4 do not necessarily always provide pulses of the same polarity. While a pulse in the reverse direction across the junction 24 will produce charge transfer in accordance with a principal teaching of this invention, it is also the case that a forward pulse will cause firing of the element adjacent the pulse source merely by building up of the voltage above the switching potential.

To prepare semiconductor devices in accordance with the present invention, it is desirable to employ methods permitting the formation of a plurality of such devices in a small area and preferably in a unitary body of semiconductor material. One method of making such devices is to prepare a sheet or strip of the semiconductor material of as large area as may be practicably made. The sheet or strip is suitably alloyed or doped by known techniques to produce therein the required regions of differing conductivity type material so that a four-layer sheet of material results. As an example, a wafer of p-type silicon is heated in the presence of n-type doping material vapors (e.g., phosphorus at 800° C.) until n-type layers are formed to a desired depth, then an alloy of p-type doping impurity (e.g., gold containing 1% indium) is applied to one face and heated to alloy and diffuse through a portion of the n-type layer.

In preparing the semiconductor devices of this invention the four layer semiconductor sheet material is processed as follows: First, the surface of the sheet of material is cleaned by the use of organic solvents or by other suitable means. Then a printing or stamping means is employed to form on the upper surface a pattern having exposed portions, or a preformed mask is applied having apertures, which exposed portions or apertures correspond to the pattern of the semiconductor material it is desired to remove to provide physical separation between regions where necessary. Thus, the pattern may be formed of a material which is not wettable by molten wax and which may be applied by stamping or through a stencil. One material suitable for this purpose is albumin applied much as an ink. The sheet of albumin coated semiconductor material is then dipped into wax and removed or coated with wax by other suitable means. The wax consistency is adjusted so that wax will be thin enough not to cover the finest lines stamped on the surface by the non-wettable albumin ink. The wax will then coat everything but the albumin inked areas. The albumin coated areas are not resistant to acid etchants while the wax areas are. The sheet of material having the patterned wax coating is then dipped into an acid etchant for a predetermined time to produce etching to the required depth through the layers. One or more etching steps may be employed. To control the depth of etching, the thickness of the printed lines may be varied with the result that very thin lines will etch more slowly than thick lines and the etchant will therefore not go as deep into the material in the same time period. In this manner, an array may be formed in which all elements have a common base (18 in FIG. 1) and selected elements have a common connecting layer (17 in FIG. 1).

The just described method is practical when using a sheet of about 1 square centimeter in area from which about one hundred individual elements may be formed. A more conveniently employed method exists which is preferable and may be used to make hugh members of uniform, interconnected elements, if desired. Methods have been discovered by which long dendritic crystals of semiconductor material may be grown in a continuous operation. These methods are applicable to produce long dendrites of semiconductor materials having the diamond cubic lattice, such as silicon, germanium and the III–V compounds. Briefly, the dendrite growing process comprises first melting a quantity of the semiconductive material. The melt temperature is brought to a temperature slightly above the melting point of the material and the melt surface is then contacted with a seed crystal having twin planes, of the material corresponding to the melt. The seed crystal is wet by the melt and has a predetermined crystallographic orientation such that when the melt is supercooled and the seed crystal is pulled at a rate above a certain minimum value, material from the melt solidifies on the seed crystal and produces an elongated flat surfaced dendritic crystal. The melt may be doped with one or more doping materials and dendrites having one doping impurity or several layers parallel to the surface may be pulled. The homogeneous dendritic crystal is then subjected to further impurity doping by diffusion alloying or other known techniques to produce the necessary four regions of alternate conductivity type material. Further information on this type of crystal growing process may be had by referring to the following copending applications: Serial No. 824,355, filed July 1, 1959, entitled "Process for Producing Selectively Doped Semiconductor Dendritic Crystals" by A. I. Bennett, Jr., now abandoned; Serial No. 844,288, filed October 5, 1959, entitled "Processes for Producing Crystals and the Products Thereof" by A. I. Bennett, Jr., now Patent 3,031,403; and Serial No. 829,069, filed July 23, 1959, entitled "Continuous Process for Producing Crystals and the Products Thereof" by A. I. Bennett, Jr. and R. L. Longini, all of which applications are assigned to the same assignee as the present invention.

Figure 5:
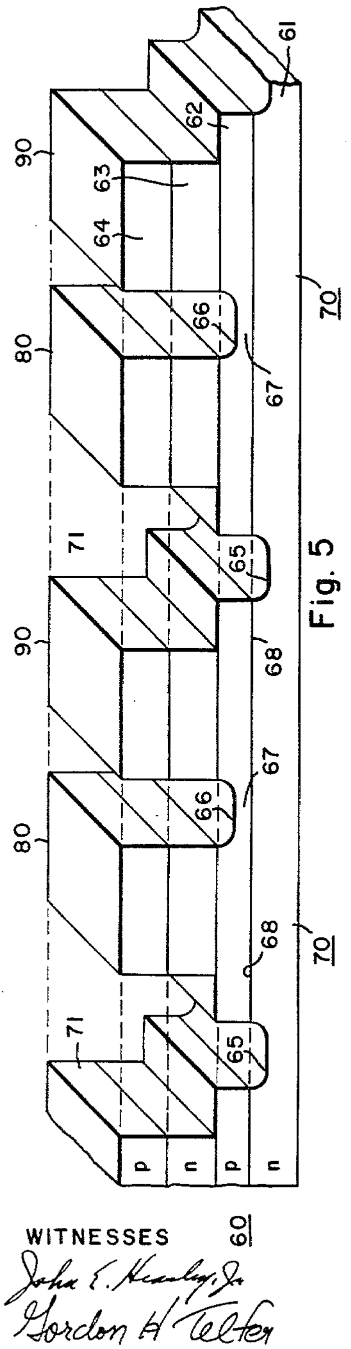
FIG. 5 is a view in perspective of a portion of a monolithic device having a plurality of semiconductor elements, such as that shown in FIG. 1, in a single unit of semiconductive material.

In accordance with the just mentioned methods, a dendritic crystal 60, shown in FIG. 5, may be formed of n-p-n-p configuration as is indicated by the layers 61, 62, 63 and 64. Etching of selected areas by means of patterns may then be carried out in a manner similar to that before described to produce a configuration such as that shown in FIG. 5 wherein the dotted lines indicate where material has been etched away. The undesired material may also be removed by other means such as suitable saws and cutting tools for mechanically separating and removing the material. The material is removed to provide a wide gap 71 through the two layers 63 and 64, and a deeply etched notch 65 passing through layer 62 and ending in layer 61. Between each deeply etched notch 65 is a semiconductor body 70 generally similar to the semiconductor body 10 used in the devices of FIG. 1 and FIG. 3. Shallower notches 66 in each body 70 separate individual elements 80 and 90 similar to the elements 30 and 40 shown in FIG. 1 and FIG. 3. All of the semiconductor bodies 70 comprise the common base layer 61. The etched crystal 60 shown in FIG. 5 may be separated at the deeply etched notches 65 to obtain a single body 70 or a plurality of such bodies 70 may be employed in a circuit as an integral unit. Further, a plurality of the units 60 shown in FIG. 5 may be arranged in mutually parallel formation to provide a huge number of elements in one array.

It will be understood that while dendritic crystals may be employed, flat strips cut from ingots of silicon or other semiconductor material, or cast into long strips may be employed to form the unit 60 of FIG. 5. The dendrites are particularly advantageous because they have a perfect (111) surface and need no etching or other surface treatment to render them usable as semiconductor members.

A desirable method is available by which etching may be carried out to form the physically separated layers 63 and 64 of the individual elements 80 and 90 shown in FIG. 5 and to partially etch through the connecting region 62. After a strip of semiconductive material 60, having the necessary four layers 61, 62, 63 and 64 of alternate conductivity type, is formed, it is etched to remove the material of layers 64 and 63 to form grooves 66 and 71 down to layer 62. Then a reverse bias of relatively large magnitude may be applied across the junction 68 between the continuous common base 61 and the connecting layer 62. This reverse bias may conveniently be of the order of 100 volts. The semiconductor body with the potential applied thereto is inserted in an electrochemical etching bath with the polarity so determined that the p-type material of layer 62 is preferentially etched away. The etching through the p-type layer 62 will cease when all that remains comprises what is known as a depletion layer 67. A depletion layer is a region in which the applied field, here provided by the reverse bias, sweeps out the charge carriers therein and leaves the remaining material with the electrical characteristics of an insulator. Since no charge carriers are available, electrochemical etching practically ceases when this region is exposed. Using this method it is apparent that the time of the etching operation need not be carefully controlled. It has been found that the thickness of the depletion layer 67 is suitable for use as the connecting portion 21 of the connecting layer 17.

The thickness of the depletion layer is controlled by the magnitude of the reverse bias applied across the junction 68. Thereby, the thickness of the remaining portion of the connecting layer 67 may be varied from almost all to almost none of the original thicknesses of the layer 62. In some applications it may be found desirable, in a single body of many elements, to provide restricted portions 67 of differing thicknesses. The value of such an arrangement is due to the fact that the extent of restriction is an important factor in determining the field established beween elements upon the application of a triggering pulse, for example. Therefore, the speed and amount of the charge transfer is regulatable to some extent by the thickness of the restricted portions 67.

Thereafter etchant is applied at areas 65 only to etch through the depletion layer 67 and a distance into layer 61.

Leads may be applied to an array of elements, whether formed from a sheet of semiconductive material or a continuously grown dendritic crystal, by a variety of methods. Among the numerous methods available are attaching by alloying, plating after filling the etched notches or troughs with a protective material such as a silicon plastic; contacting with ganged cat-whiskers which may be mounted in a fine-poured rubber mass with individual leads, as by a conducting rubber lattice in an insulating rubber matrix. In this latter case, such a layer may act as an intermediate layer to a printed circuit which in turn has suitable leads or contact points.

In accordance with the before-mentioned methods, or a combination thereof, a unit 60 such as that shown in FIG. 5 may be formed in which the various layers 61, 62, 63 and 64 of semoconductor material are typically of a thickness of about .0005 to .001 inch in thickness, although the common base 61 may be much thicker if desired. Therefore, the total thickness of the semiconductor unit 60 may be about 4 mils. The area of each of the individual elements 80 and 90 is about 1 square millimeter. The gap 66 between the elements 80 and 90 may be of a width of about 2 mils. Therefore, it is seen that the device made in accordance with the present invention may be of extremely small size and yet perform operations for which in the past it has been necessary to provide several larger elements.

The materials of which the semiconductor units 60 are formed may be, for example, silicon or germanium as a semiconductor lattice material with suitable doping impurities therein. The p-type conductivity regions are doped with about $10^{14}$ to $10^{17}$ atoms per cc. of a suitable doping impurity such as boron or indium. The n-type conductivity regions comprise suitable doping materials such as antimony or phosphorus in a concentration of about $10^{14}$ to $10^{17}$ atoms per cc. Devices are preferably made wherein the regions adjacent the breakdown junctions 23 and 25, as shown in FIG. 1, are doped about equally and in concentration of about $10^{14}$ atoms per cc. The materials used in the described device and the doping impurities therein are determined to some extent by the method by which the semiconductor body is formed. Therefore, reference should be made to the before-mentioned copending applications for compositions from which devices in accordance with this invention may be made by the continuous dendritic crystal growing process.

Figure 6:
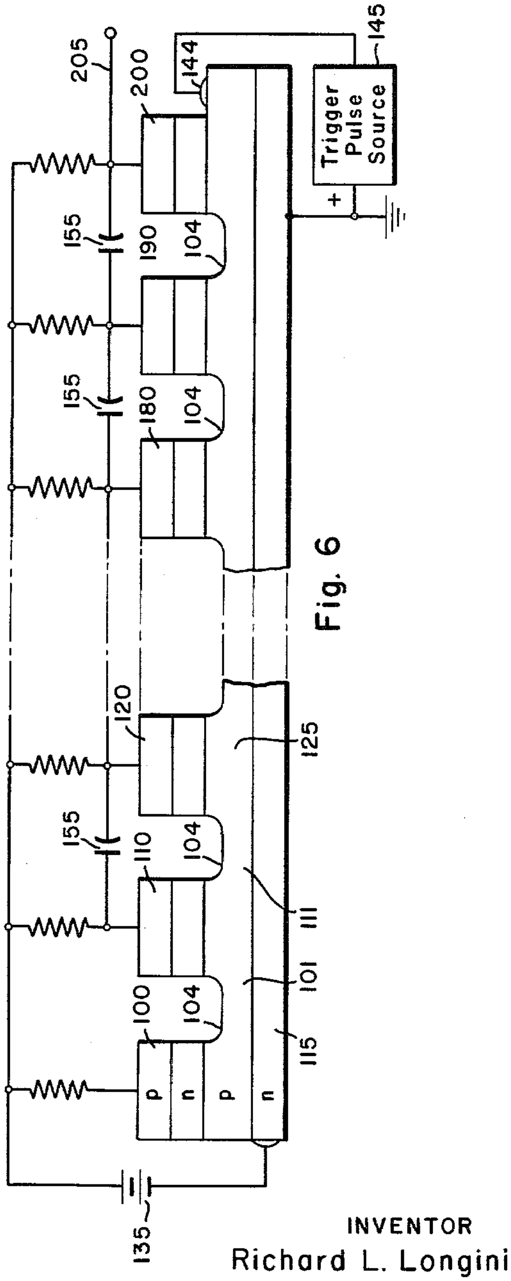
FIG. 6 is a schematic diagram, partly in elevation, of a solid state counter circuit made in accordance with the present invention.

An advantageous application for a long series of elements in accordance with the present invention is that shown in FIG. 6, which is a counter circuit. Each of the elements 100, 110, 120, . . . ,180, 190, 200 of FIG. 6 have in common a continuous n-type conductivity base layer 115 and a partially etched adjacent p-type conductivity connecting layer 125. The device shown in FIG. 6 may therefore comprise a series of identical elements having the aforesaid common semiconductive regions. The procedures for etching the gaps 104 will be those used for gap 66 in FIG. 5. The number of elements in the series will depend upon the particular application made of the device. In the following description it will be assumed that the device is of the p-n-p-n configuration. However, it is apparent that the opposite conductivity sequence may be used. In the utilization of the device of FIG. 6 a continuous voltage source 135 continuously applies a forwardly directed voltage across the first element 100 to an extent that element 100 will be in the "on" position establishing the excess carrier density region which was described with reference to FIG. 1. Upon application of a triggering pulse to the contact 144 by means of the pulse source 145 a field is established across the restricted portion 101 causing the movement of the excess carriers to the second element of the device 110 thereby causing it to fire to the "on" position. It will be convenient in operation of such a counter to maintain the first element 100 always in the "on" position and therefore no capacitance coupling is provided between it and the second element 110. Therefore, the first and second elements 100 and 110 are now in the "on" position and the remaining elements in the counter are in the "off" position. An excess carrier density region now exists in the second element 110 in relation to the corresponding portion of the connecting layer in the third element 120 such that upon the application of another triggering pulse the element 120 fires to the "on" position, and, if desired, a coupling capacitor 155 may be provided between the elements to switch the second element to the "off" position. Such operation may continue throughout the remaining elements of the device.

The triggering pulse applied by the source 145 has no effect on elements which are already in the "on" position. Also, the triggering pulse has no effect on elements, even though "off," which are situated remote from the point 144 of pulse application. That is, the pulse triggers only the first "off" element in its path. This suggests a modification wherein the "pilot" element, which is always "on," is placed in the middle of the row and triggering pulses may be applied at either end.

Counters such as that shown in FIG. 6 are particularly useful in computer applications where many elements are desirable in a small space.

The device shown in FIG. 6 is a counter to the base ten, i.e., after ten triggering pulses are applied, an output signal is derived from the output 205 of the eleventh element 200. If the coupling capacitors 155 were not employed to extinguish previous elements, the output of the last element could be used for that purpose.

The output of the device shown in FIG. 6, when the last element 200 fires, may be employed so as to serve as the triggering pulse for another counter. That is, the "on" state in the second counter would advance one position each time ten counts are made in the first counter. Of course, capacitive coupling may be employed to extinguish the last element 200 of the first counter so that it can start a new counting cycle.

A counter may, of course, be provided having a base other than ten. Also, a plurality of counters may use the same pilot element or the pilot elements of a plurality of counters may be interconnected. In this case it is necessary to make sure that all of the plurality have their pilots in the "on" position and that no current lagging takes place.

A particularly useful device is a counter such as that just described to the base four. This counter comprises a pilot element which is disposed in a row with four elements and a triggering pulse contact on each side of it. This arrangement actually constitutes two counters whereby the output of one counter may be employed to trigger the second. It is demonstrable by calculation that such a counter to the base four permits the storage of more information per element than a counter to any other base.

While the present invention has been shown in a few forms only, it will be obvious to those skilled in the art that it is not so limited but is susceptible of various changes and modifications without departing from the spirit and scope thereof.

I claim as my invention:

1. A semiconductor device comprising a body of semiconductive material having a first continuous layer of a first conductivity type and a second continuous layer of a second conductivity type adjacent and forming a rectifying junction with said first continuous layer, said second continuous layer having a first portion and a second portion mutually separated by a portion of restricted thickness, each of said first and second portions of said second continuous layer having disposed thereon physically separated regions of material of said first conductivity type thereby forming first and second breakdown junctions, separated regions of said second conductivity type disposed on the remote surface of said separated regions of said first conductivity type; means to apply a voltage across said semiconductor body sufficient to cause breakdown of said first breakdown junction, means to apply a triggering pulse to said second continuous layer to cause breakdown of said second breakdown junction, and circuit means coupled to extinguish said first element upon the firing of said second element.

2. A semiconductor device comprising a body of semiconductive material having a first continuous layer of a first conductivity type and a second continuous layer of a second conductivity type adjacent to and forming a p-n junction with said first continuous layer, said second continuous layer having a first portion and a second portion separated by a portion of restricted thickness, said first and second portions of said second continuous layer each adjacent to and forming a p-n junction with separate regions of material of said first conductivity type disposed on the surface of said second continuous layer remote from said first continuous layer, said separate regions of material of said first conductivity type each adjacent to and forming a p-n junction with separate regions of material of said second conductivity type disposed remote from said second continuous layer, means to inject minority carriers into the first portion of said second continuous layer, means to establish an electric field between said first and second portions of said second continuous layer to direct carriers from said first portion to said second portion and to establish a reverse bias across said p-n junction between said first and second continuous layers.

3. A semiconductor device comprising a body of semiconductive material having a first continuous layer of a first conductivity type and a second continuous layer of a second conductivity type adjacent to and forming a p-n junction with said first continuous layer, said second continuous layer having a first portion and a second portion mutually separated by a portion of restricted thickness, said first and second portions of said second continuous layer adjacent to and forming a p-n junction with separate regions of materials of said first conductivity type disposed on the surface of said second continuous layer remote from said first continuous layer, said separate regions of materials of said first conductivity type each adjacent to and forming a p-n junction with separate regions of material of said second conductivity type disposed remote from said second continuous layer, means to produce a state of excess carrier density in said first portion of said second continuous layer, means to establish an electric field between said first portion and said second portion of said second continuous layer to direct excess carriers from said first portion to said second portion to establish a state of excess carrier density in said second portion of said second continuous layer.

4. A semiconductor device comprising an elongated strip of semiconductive material having four layers of alternate conductivity type material, said strip having material selectively removed therefrom so as to form a plurality of semiconductor elements, all of said elements having a common base layer comprising a first layer of said four layers, two or more of said elements having a common connecting layer comprising a second layer of said four layers, said first and second layers disposed so as to form a rectifying junction therebetween, means to establish a region of excess charge density in a selected portion of said common connecting layer and means to direct said excess charges to another portion of said common connecting layer including a source of trigger pulses that establishes a reverse bias across said rectifying junction between said first and second layers.

5. A unitary semiconductor device comprising a dendritic crystal of semiconductor material grown from a seed crystal having a twin plane and processed so as to form four mutually parallel semiconductive layers of alternate conductivity type material extending along the length of said dendritic crystal, said crystal having material selectively removed therefrom so as to form a plurality of semiconductor elements having a bistable voltage-current characteristic, all of said semiconductor elements having a common base layer comprising a first of said four semiconductive layers on the surface of said dendritic crystal, two or more of said semiconductor elements having a common connecting layer having a restricted portion between said elements, said common connecting layer comprising a second of said four semiconductive regions adjacent to and forming a rectifying junction with said common base layer, the third and fourth of said four semiconductive layers being separated into portions each of which are confined to only one of said semiconductor elements, means to inject minority carriers into a portion of said common connecting layer in a first of said semiconductor elements to establish a region of excess charge density therein and means to direct said excess charges to another portion of said common connecting layer in a second of said semiconductor elements.

6. A solid state flip-flop circuit comprising a body of semiconductive material having a first continuous layer of a first conductivity type and a second continuous layer of a second conductivity type adjacent to and forming a p-n junction with said first continuous layer, said second continuous layer having a first portion and a second portion separated by a portion of restricted thickness, said first and second portions of said second continuous layer each adjacent to and forming a p-n junction with separate regions of material of said first conductivity type disposed on the surface of said second continuous layer remote from said first continuous layer, said separate regions of material of said first conductivity type each adjacent to and forming a p-n junction with separate regions of material of said second conductivity type disposed remote from said second continuous layer, said separate regions of material of said second conductivity type each having on an exposed surface thereof an ohmic contact coupling said body of semiconductive material to a power source disposed so as to provide a reverse voltage across said p-n junctions between said second continuous layer of said second conductivity type and said separate regions of material of said first conductivity type, means to apply a trigger pulse source across said p-n junction between said first and second continuous layers, said trigger pulse source establishing an electric field between said first and second portions of said second continuous layer for the acceleration of charge carriers therebetween, said trigger pulse source also establishing a reverse bias across said p-n junction between said first and second continuous layers.

7. A solid state flip-flop circuit comprising a unitary semiconductive body having two four layer, bistable elements, said two bistable elements having a common semiconductive region, means including a source of relatively fixed potential applied across said first and second elements in parallel for placing one of said bistable elements in a conductive state thereby establishing a region of excess charge density therein, means including a pulse source applied to said common region at a position closer to said second element than said first element for directing said excess charges through said common semiconductive region to said second bistable element to switch said second bistable element to the conductive state.

8. A solid state multivibrator circuit comprising a pair of four zone bistable semiconductor elements having a common semiconductive region, means including a source of relatively fixed potential applied across said first and second elements in parallel to place one of said semiconductor elements in the conductive state, means comprising a trigger pulse source to direct charges from said first element through said common semiconductive region to said second element thereby placing said second element in the conductive state, circuit means coupled to said trigger pulse source and said semiconductive body to maintain oscillations between said two semiconductor elements in accordance with the application of pulses by said trigger pulse source.

9. A solid state counter circuit comprising a body of semiconductive material formed from a dendritic crystal processed to form four layers of successively opposite conductivity type material, said dendritic crystal having material selectively removed therefrom so as to form a plurality of successive semiconductive elements having a bistable voltage-current characteristic, all of said elements having a common base layer comprising a first of said four semiconductor layers, all of said elements also having a common connecting layer comprising a second of said four semiconductive layers adjacent to and forming a p-n junction with said first layer, means to inject minority carriers and thereby establish a region of excess charge density in a portion of said common connecting layer in at least the first of said bistable elements, means comprising a triggering pulse source to successively direct charges to an additional portion of said common connecting layer whereby a next succeeding bistable element is successively placed in the conductive state.

10. Electronic apparatus capable of bistable operation suitable for flip-flops, multivibrators, counters and the like, said apparatus comprising: a unitary body of semiconductive material including first and second regions of opposite semiconductivity type with a p-n junction therebetween, a first plurality of regions of the same semiconductivity type as said first region disposed on spaced portions of said second region and a second plurality of regions of material each disposed on one of said first plurality of regions and capable of injecting minority carriers therein, said regions in association forming a plurality of semiconductor device portions each having a p-n junction which breaks down when sufficient reverse potential exists thereacross to cause switching of the device portion from a first stable state of high resistance to a second stable state of low resistance with injection of minority carriers across said junction into said second region; contact means to make electrical contacts individually disposed on each of said second plurality of regions, on said first region and on a peripheral portion of said second region; D.C. power supply means electrically coupled to apply a continuous potential difference across the contact means on the first region and the region of said second plurality of regions of each device portion, said potential being sufficient to place a first device portion in said state of low resistance; trigger pulse means electrically coupled to the contact means on said first and second regions selectively to provide an electric field in said second region to cause current carriers from said first device portion to travel to a second device portion thereby to cause said second device portion to switch to said state of low resistance, said trigger pulse means also producing a reverse bias across said p-n junction between said first and second regions.

References Cited by the Examiner

UNITED STATES PATENTS

| | | | |
|---|---|---|---|
| 2,856,544 | 10/58 | Ross | 307—88.5 |
| 2,910,634 | 10/59 | Rutz | 307—88.5 |
| 2,936,384 | 5/60 | White | 307—88.5 |
| 2,936,425 | 5/60 | Shockley | 307—88.5 |
| 2,967,952 | 1/61 | Shockley | 307—88.5 |
| 2,992,337 | 7/61 | Rutz | 307—88.5 |
| 3,038,085 | 6/62 | Wallmark et al. | 307—88.5 |
| 3,040,195 | 6/62 | Jones et al. | 307—88.5 |
| 3,047,733 | 7/62 | Rutz | 307—88.5 |
| 3,070,711 | 12/62 | Marcus et al. | 307—88.5 |
| 3,097,308 | 7/63 | Wallmark | 307—88.5 |

OTHER REFERENCES

Article, "New Solid-State Devices and Applications." Electronics, April 7, 1959.

JOHN W. HUCKERT, *Primary Examiner.*

HERMAN KARL SAALBACH, *Examiner.*